US012622178B2

(12) United States Patent
Wang

(10) Patent No.: US 12,622,178 B2
(45) Date of Patent: May 5, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventor: Hui-Lin Wang, Taipei City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 379 days.

(21) Appl. No.: 18/135,717

(22) Filed: Apr. 17, 2023

(65) Prior Publication Data

US 2024/0315139 A1 Sep. 19, 2024

(30) Foreign Application Priority Data

Mar. 13, 2023 (TW) ................................. 112109125

(51) Int. Cl.
| | |
|---|---|
| *H10N 50/01* | (2023.01) |
| *G11C 11/16* | (2006.01) |
| *H10B 61/00* | (2023.01) |
| *H10N 50/10* | (2023.01) |
| *H10N 50/80* | (2023.01) |

(52) U.S. Cl.
CPC ........... *H10N 50/01* (2023.02); *G11C 11/161* (2013.01); *H10B 61/00* (2023.02); *H10N 50/10* (2023.02); *H10N 50/80* (2023.02)

(58) Field of Classification Search
CPC ...... G11C 11/161; H10B 61/00; H10B 61/22; H10N 50/01; H10N 50/10; H10N 50/20; H10N 50/80
USPC ........................................................ 257/421
See application file for complete search history.

(56) References Cited

U.S. PATENT DOCUMENTS

| | | | |
|---|---|---|---|
| 9,230,626 B2 | 1/2016 | Buhrman | |
| 2014/0116981 A1* | 5/2014 | Burke | G03F 7/095 430/296 |
| 2021/0167281 A1* | 6/2021 | Wang | H10N 50/01 |
| 2021/0367143 A1* | 11/2021 | Lee | H10N 50/01 |

* cited by examiner

*Primary Examiner* — Fazli Erdem
(74) *Attorney, Agent, or Firm* — Winston Hsu

(57) ABSTRACT

A method for fabricating a semiconductor device includes the steps of first forming a spin orbit torque (SOT) layer on a substrate, forming a magnetic tunneling junction (MTJ) on the SOT layer, forming a first cap layer on the MTJ, forming a first inter-metal dielectric (IMD) layer on the first cap layer, forming a second cap layer on the first cap layer and the first IMD layer, forming a second IMD layer on the first cap layer, the first IMD layer, and the second cap layer, and then planarizing the first cap layer, the first IMD layer, the second cap layer, and the second IMD layer.

17 Claims, 11 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of first forming a spin orbit torque (SOT) layer on a substrate, forming a magnetic tunneling junction (MTJ) on the SOT layer, forming a first cap layer on the MTJ, forming a first inter-metal dielectric (IMD) layer on the first cap layer, forming a second cap layer on the first cap layer and the first IMD layer, forming a second IMD layer on the first cap layer, the first IMD layer, and the second cap layer, and then planarizing the first cap layer, the first IMD layer, the second cap layer, and the second IMD layer.

According to another aspect of the present invention, a semiconductor device includes a spin orbit torque (SOT) layer on a substrate, a magnetic tunneling junction (MTJ) on the SOT layer, a first cap layer adjacent to the MTJ, a first inter-metal dielectric (IMD) layer adjacent to the first cap layer, and a second cap layer adjacent to the first cap layer and the first IMD layer.

According to yet another aspect of the present invention, a semiconductor device includes a spin orbit torque (SOT) layer on a substrate, a magnetic tunneling junction (MTJ) on the SOT layer, and a first cap layer around the MTJ.

Preferably, the MTJ includes a circular shape in a top view and the first cap layer includes a first ring in a top view.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
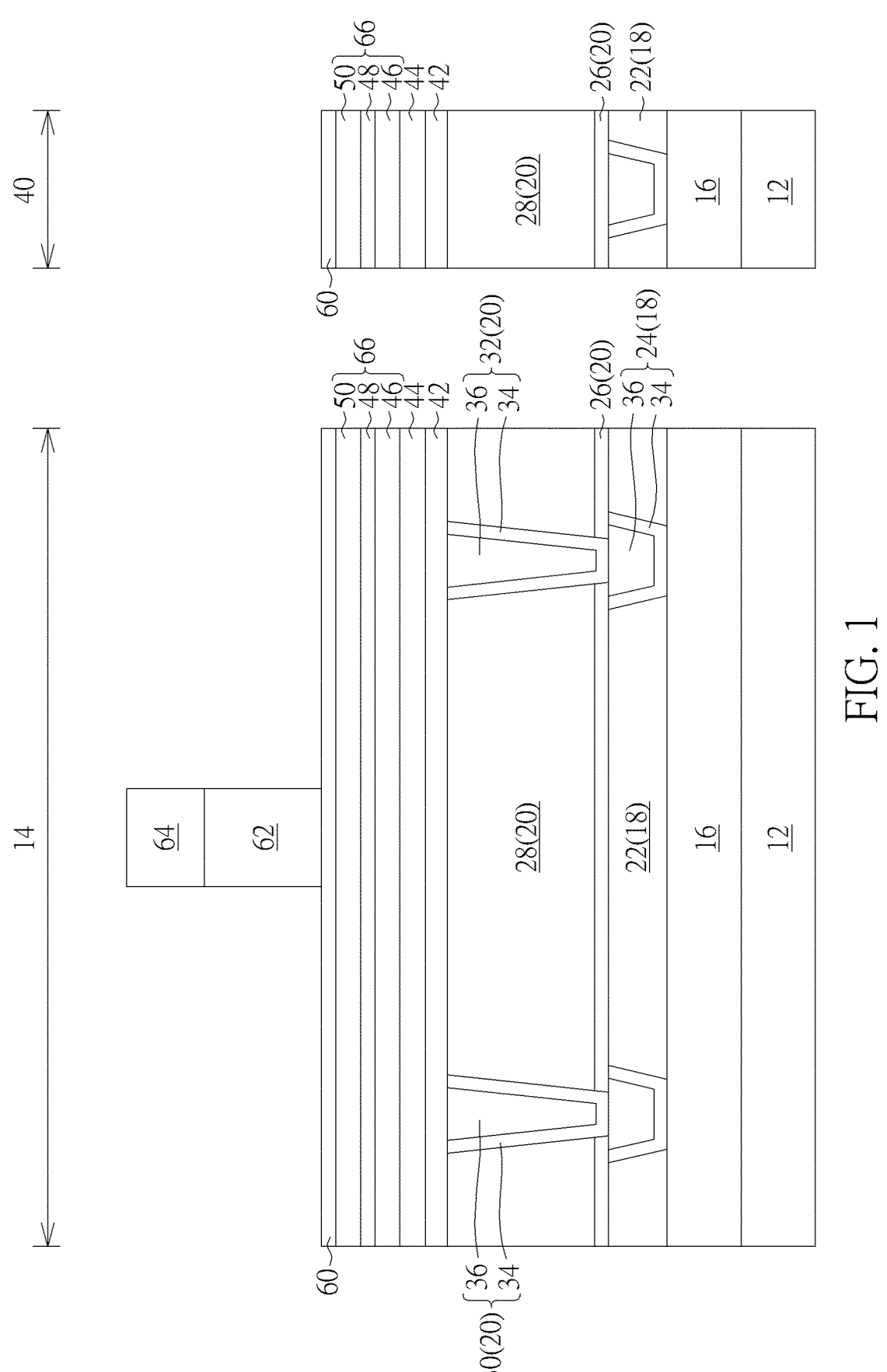
FIGS. 1-8 illustrate a method for fabricating a MRAM device according to an embodiment of the present invention.

Referring to FIGS. 1-8, FIGS. 1-8 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 40 are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 18, 20 are sequentially formed on the ILD layer 16 to electrically connect the aforementioned contact plugs, in which the metal interconnect structure 18 includes an inter-metal dielectric (IMD) layer 22 and metal interconnections 24 embedded in the IMD layer 22, and the metal interconnect structure 20 includes a stop layer 26, an IMD layer 28, and metal interconnections 30, 32 embedded in the stop layer 26 and the IMD layer 28. It should be noted that in contrast to metal interconnections 24, 30, 32 are disposed in the IMD layers 24, 28 on the MRAM region 14, only metal interconnection 24 is embedded in the IMD layer 22 while no metal interconnection is disposed in the IMD layer 28 on the logic region 40 at this stage.

In this embodiment, each of the metal interconnections 24 from the metal interconnect structure 18 preferably includes a trench conductor and each of the metal interconnections 30, 32 from the metal interconnect structure 20 includes a via conductor. Preferably, each of the metal interconnections 24, 30, 32 from the metal interconnect structures 18, 20 could be embedded within the IMD layers 22, 28 and/or stop layer 26 according to a single damascene process or dual damascene process. For instance, each of the metal interconnections 24, 30, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 24 are preferably made of copper, the metal layers 36 in the metal interconnections 30, 32 are preferably made of tungsten, the IMD layers 22, 28 are preferably made of silicon oxide or ultra low-k (ULK) dielectric layer, and the stop layers 26 is preferably made of nitrogen doped carbide (NDC), silicon nitride, silicon carbon nitride (SiCN), or combination thereof.

Next, a selective bottom electrode 42, a spin orbit torque (SOT) layer 44, a MTJ stack 66, a cap layer 60, and a patterned mask 62 are formed on the metal interconnect structure 20. In this embodiment, the formation of the MTJ stack 66 could be accomplished by sequentially depositing a free layer 46, a barrier layer 48, a reference layer (not shown), a spacer (not shown), and a pinned layer 50 on the SOT layer 44. Preferably, the free layer 46 could be made of ferromagnetic material including but not limited to for example iron, cobalt, nickel, or alloys thereof such as cobalt-iron-boron (CoFeB), in which the magnetized direction of the free layer 46 could be altered freely depending on the influence of outside magnetic field. The barrier layer 48 could be made of insulating material including but not limited to for example oxides such as aluminum oxide (AlO$_x$) or magnesium oxide (MgO).

The reference layer is disposed between the barrier layer 48 and the spacer, in which the reference layer could be made of ferromagnetic material including but not limited to for example iron, cobalt, nickel, or alloys thereof such as cobalt-iron-boron (CoFeB). The spacer could be a non-magnetic layer made of non-magnetic material including but not limited to for example ruthenium (Ru), iridium (Ir), rhodium (Rh), or combination thereof.

The pinned layer 50 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 50 is formed to fix or limit the direction of magnetic moment of adjacent layers. Specifically, the pinned layer 50 further includes a bottom synthetic antiferromagnetic (SAF) layer, a coupling layer, and a top SAF layer, in which the bottom SAF layer and the top SAF layer could include same or different materials while both layers could include ferromagnetic material such as cobalt (Co), nickel (Ni), platinum (Pt), palladium (Pd), or combination thereof. The coupling layer may also include materials to provide mechanical and/or crystalline structural support for the bottom SAF layer and the top SAF layer. Preferably, the coupling layer includes material that aides in this coupling including but not limited to ruthenium (Ru), tantalum (Ta), gadolinium (Gd), platinum (Pt), hafnium (Hf), or combination thereof.

Moreover, the selective bottom electrode 42 could include conductive material such as but not limited to for example Ta, TaN, Pt, Cu, Au, Al, or combination thereof, the SOT layer 44 is serving as a channel for the MRAM device as the SOT layer 44 could include metals such as tantalum (Ta), tungsten (W), platinum (Pt), or hafnium (Hf) and/or topological insulator such as bismuth selenide (Bi$_x$Se$_{1-x}$). The cap layer 60 preferably includes metal such as Ru, and the hard mask 62 preferably includes conductive or dielectric material such as tantalum (Ta), tantalum nitride (TaN), titanium (Ti), titanium nitride (TiN), platinum (Pt), copper (Cu), gold (Au), aluminum (Al), or combination thereof.

It should be noted that in contrast to conventional SOT layer 44 not including atoms or dopants other than metal, it would be desirable to implant nitrogen atoms and/or oxygen atoms into the SOT layer 44 in this embodiment through ion implantation process so that the SOT layer 44 formed would include nitrogen and/or oxygen atoms. According to an embodiment of the present invention, the SOT layer 44 could be made of metal nitride or metal oxide. For example, if the original SOT layer 44 were made of tungsten (W), the SOT layer 44 after being implanted with dopants such as nitrogen or oxygen would be made of tungsten nitride (WN) or tungsten oxide (WO). If the original SOT layer 44 were made of platinum (Pt), the SOT layer 44 after being implanted with nitrogen or oxygen would then be made of platinum nitride (PtN) or platinum oxide (PtO), which are all within the scope of the present invention. By implanting dopants such as nitrogen or oxygen into the SOT layer 44, it would be desirable to create a clearer endpoint so that etching process could be stopped on the SOT layer 44 during patterning of MTJ stack 66 for forming MTJ in the later process thereby preventing over loss of SOT layer 44.

In this embodiment, the formation of the patterned hard mask 62 could be accomplished by first forming a dielectric layer 64 on an un-patterned hard mask 62 and then using a patterned mask (not shown) such as patterned resist as mask to remove part of the dielectric layer 64 and part of the hard mask 62 through reactive ion etching (RIE) process for forming a patterned dielectric layer 64 and a patterned hard mask 62. The dielectric layer 64 made of silicon oxide could be selectively removed thereafter.

Figure 2:
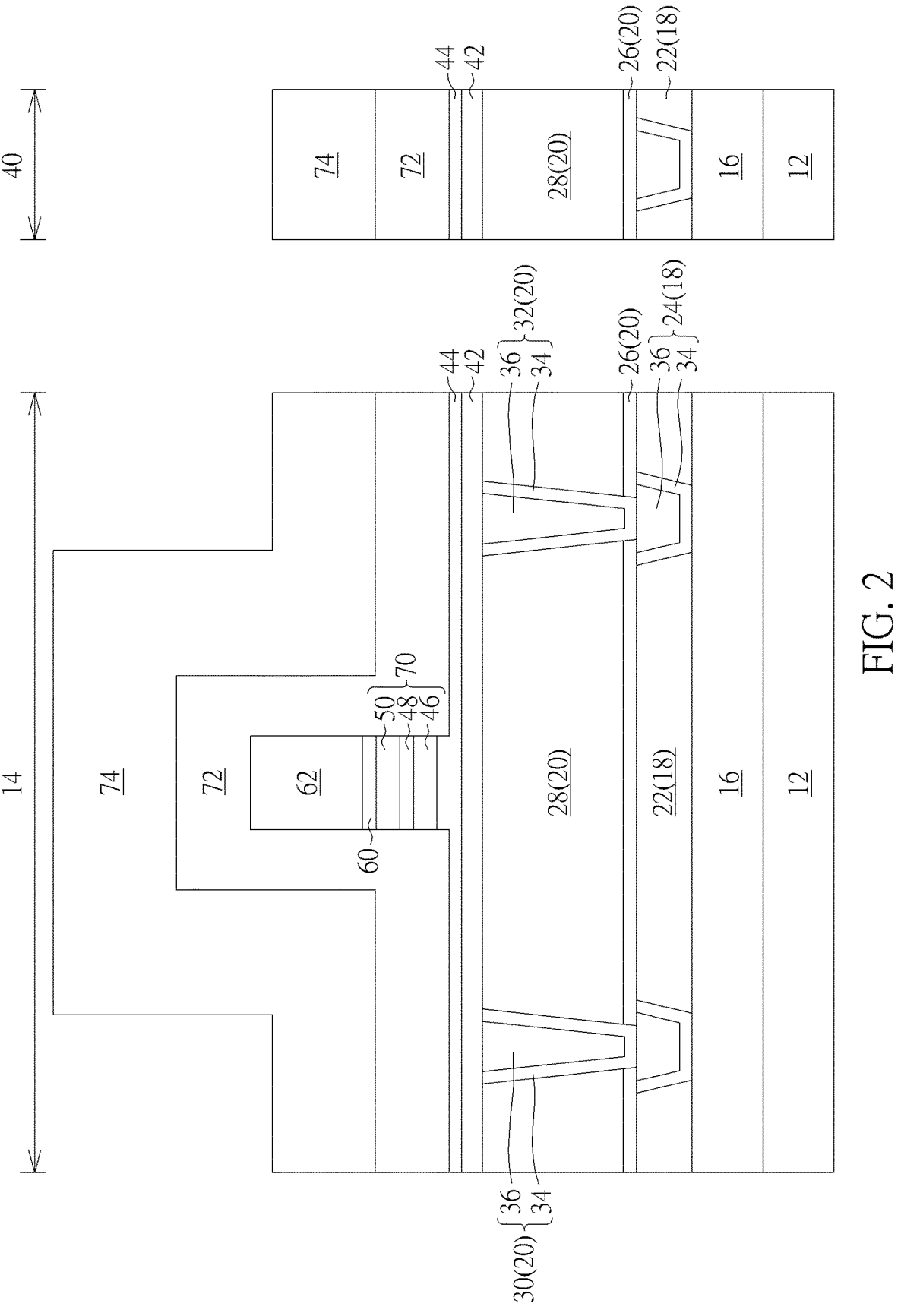

Next, as shown in FIG. 2, the patterned dielectric layer 64 or the patterned hard mask 62 is used as a mask to remove part of the cap layer 60, part of the MTJ stack 66, and even part of the SOT layer 44 for forming a MTJ 70, and then a first cap layer 72 is formed on the MTJ 70 and an inter-metal dielectric (IMD) layer 74 is formed on the first cap layer 72. In this embodiment, the first cap layer 72 is preferably made of silicon nitride while the IMD layer 74 is made of silicon oxide. It should be noted that when the patterned hard mask 62 is used to pattern the MTJ stack 66 for forming the MTJ 70, part of the SOT layer 44 could be removed at the same time so that the top surface of the remaining SOT layer 44 adjacent to two sides of the MTJ 70 is slightly lower than the top surface of the SOT layer 44 directly under the MTJ 70. According to an embodiment of the present invention, if none of the SOT layer 44 is removed during the formation of the MTJ 70, the top surface of the SOT layer 44 adjacent to two sides of the MTJ 70 would be even with the top surface of the SOT layer 44 directly under the MTJ 70. Moreover, the first cap layer 72 and the IMD layer 74 formed at this stage are preferably disposed on the MRAM region 14 and the logic region 40 at the same time.

Figure 3:
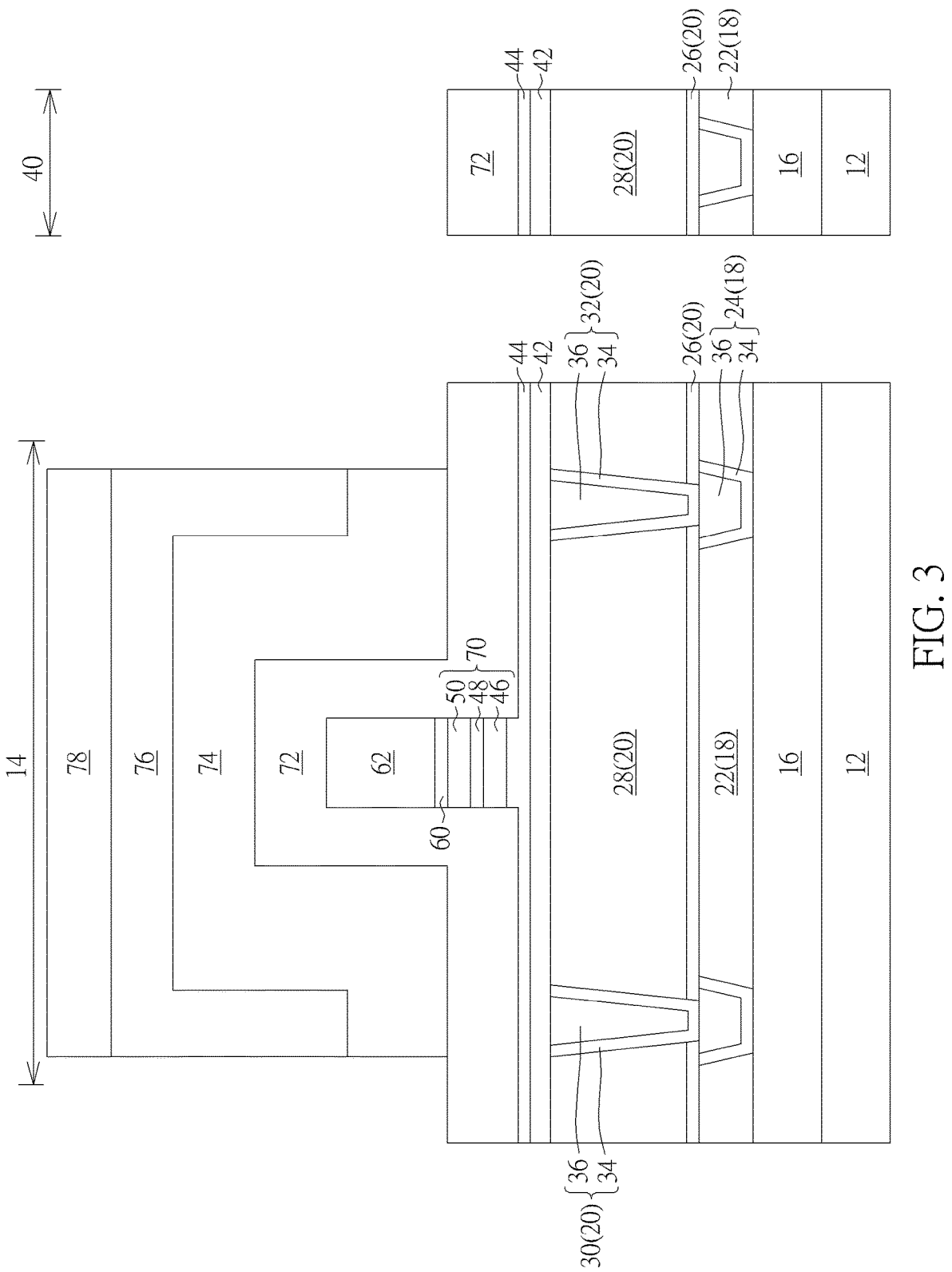

Next, as shown in FIG. 3, a bottom anti-reflective coating (BARC) 76 is formed on the IMD layer 74, and then an etching process such as an ion beam etching (IBE) process is conducted by using a patterned mask 78 such as a patterned resist as mask to remove part of the BARC 76 and part of the IMD layer 74 on the MRAM region 14 and all of the BARC 76 and IMD layer 74 on the logic region 40 for exposing the surface of the first cap layer 72 underneath. Preferably, the remaining IMD layer 74 is only disposed on the MRAM region 14 while the first cap layer 72 underneath is still disposed on the MRAM region 14 and the logic region 40.

Figure 4:
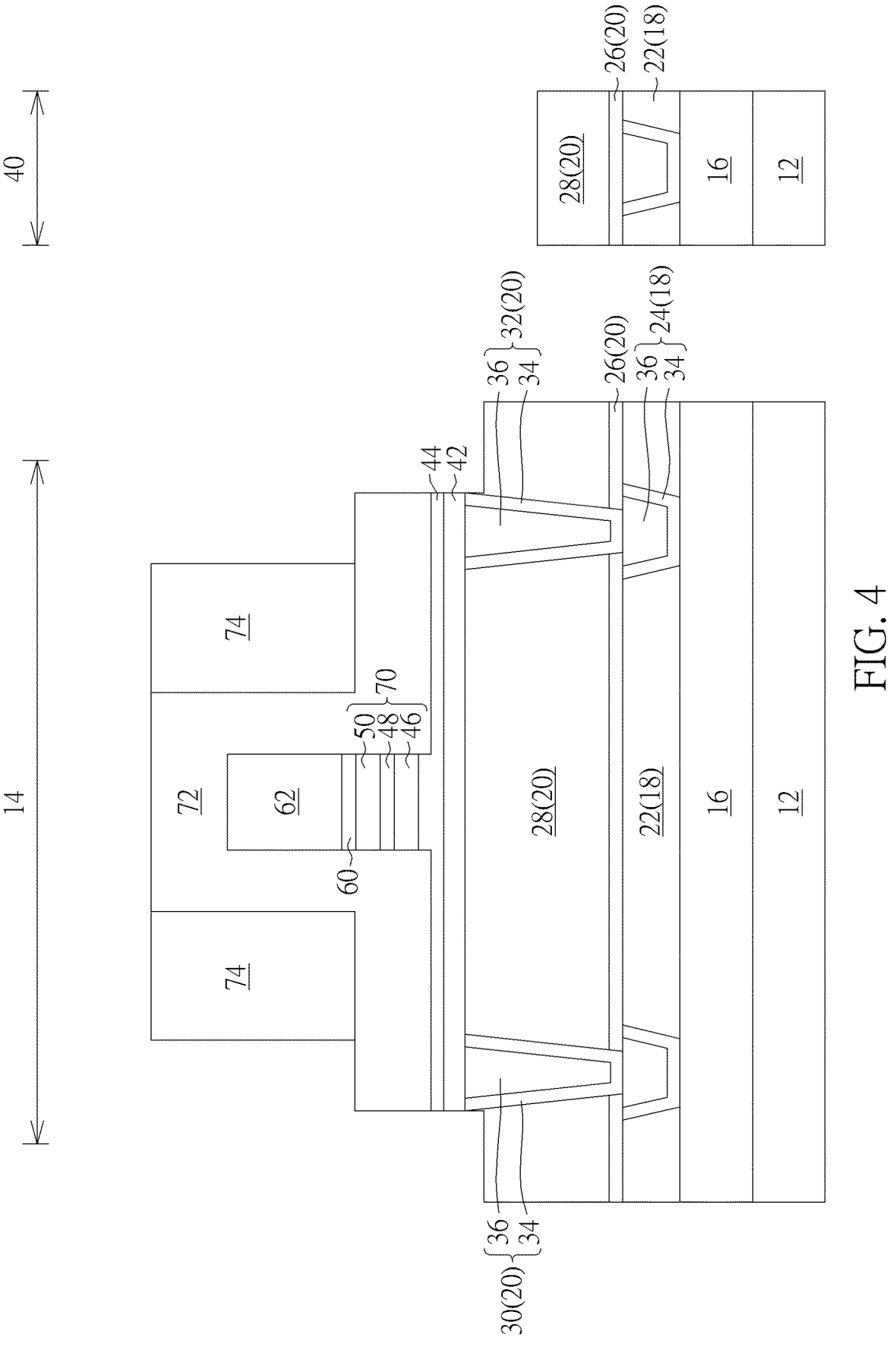

Next, as shown in FIG. 4, the BARC 76 could be removed to expose the IMD layer 74 on the MRAM region 14, and then an etching process such as an IBE process is conducted without forming other patterned mask to remove part of the IMD layer 74, part of the first cap layer 72, part of the SOT layer 44, part of the bottom electrode 42, and even part of the IMD layer 28 on the MRAM region 14 and all the first cap layer 72, all the SOT layer 44, and part of the IMD layer 28 on the logic region 40. This reduces the width of the first cap layer 72, the SOT layer 44, the bottom electrode 42, and part of the IMD layer 28 on the MRAM region 14 so that the left and right sidewalls of the first cap layer 72, the SOT layer 44, the bottom electrode 42, and part of the IMD layer 28 are retracted inward and even aligned with the sidewalls of the metal interconnection 32. The top surface of the remaining IMD layer 28 on the logic region 40 on the other hand could be slightly lower than the top surface of the IMD layer 28 on the MRAM region 14.

It should be noted that even though the IBE process conducted at this stage removes part of the IMD layer 28 during the patterning of the first cap layer 72, the SOT layer 44, and the bottom electrode 42, according to other embodiment of the present invention, it would also be desirable to not removing any of the IMD layer 28 during the patterning of the first cap layer 72, the SOT layer 44, and the bottom electrode 42. In this instance, after the first cap layer 72, the SOT layer 44, and the bottom electrode 42 are patterned the left and right sidewalls of the first cap layer 72, the SOT layer 44, and the bottom electrode 42 could still be aligned with sidewalls of the metal interconnection 32 while the top surface of the IMD layer 28 adjacent to two sides of the first cap layer 72 or SOT layer 44 is even with the top surface of the IMD layer 28 directly under the MTJ 70, which is also within the scope of the present invention.

Figure 5:
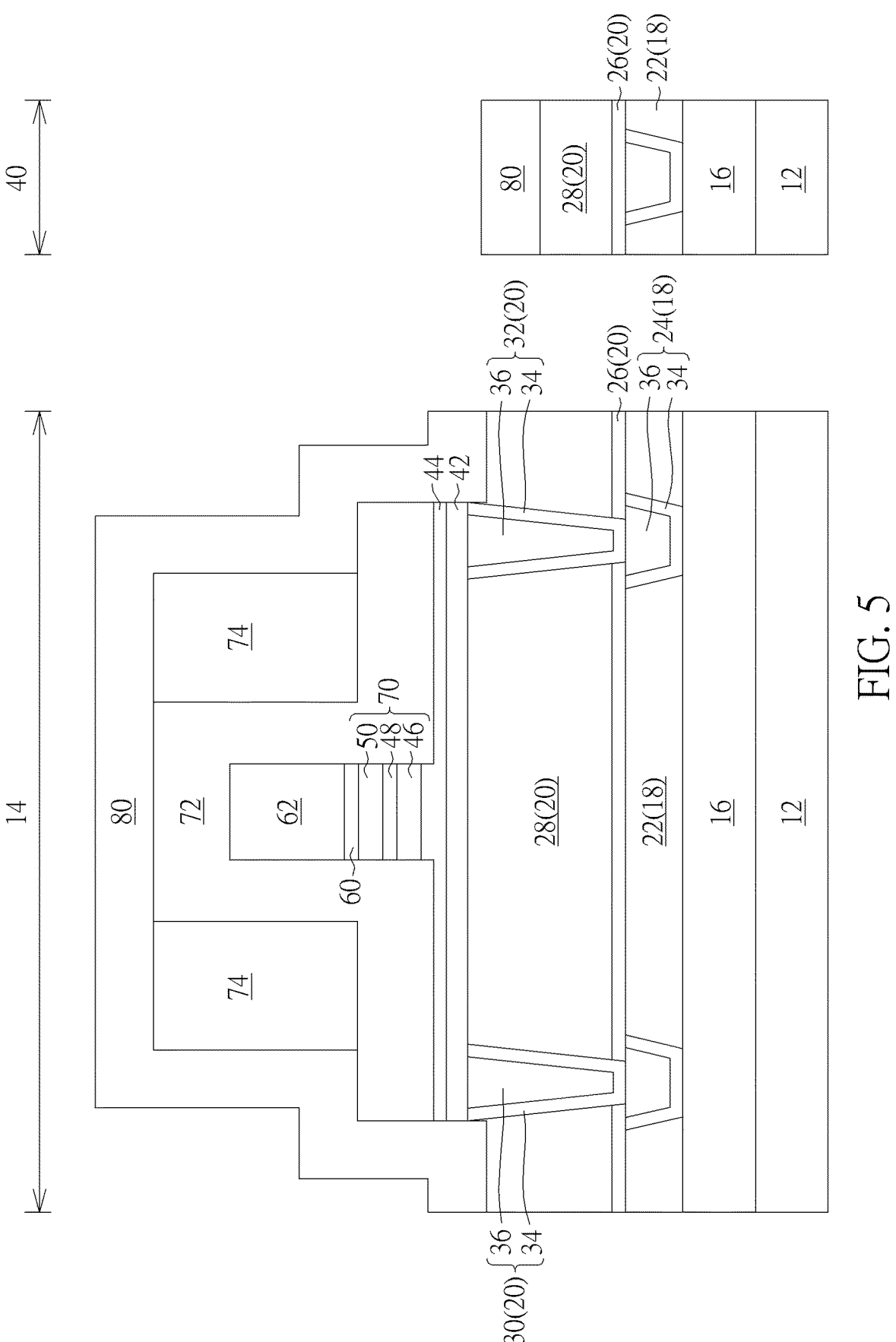

Next, as shown in FIG. 5, a second cap layer 80 is formed on the first cap layer 72, the IMD layer 74, and the IMD layer 28, in which the second cap layer 80 preferably covers the top surface of the first cap layer 72, the top surface of the IMD layer 74, the sidewalls of the IMD layer 74, the sidewalls of the first cap layer 72, the sidewalls of the SOT layer 44, the sidewalls of the bottom electrode 42, and the top surface of the IMD layer 28. In this embodiment, the first cap layer 72 and the second cap layer 80 are preferably made of same material such as silicon nitride (SiN).

Figure 6:
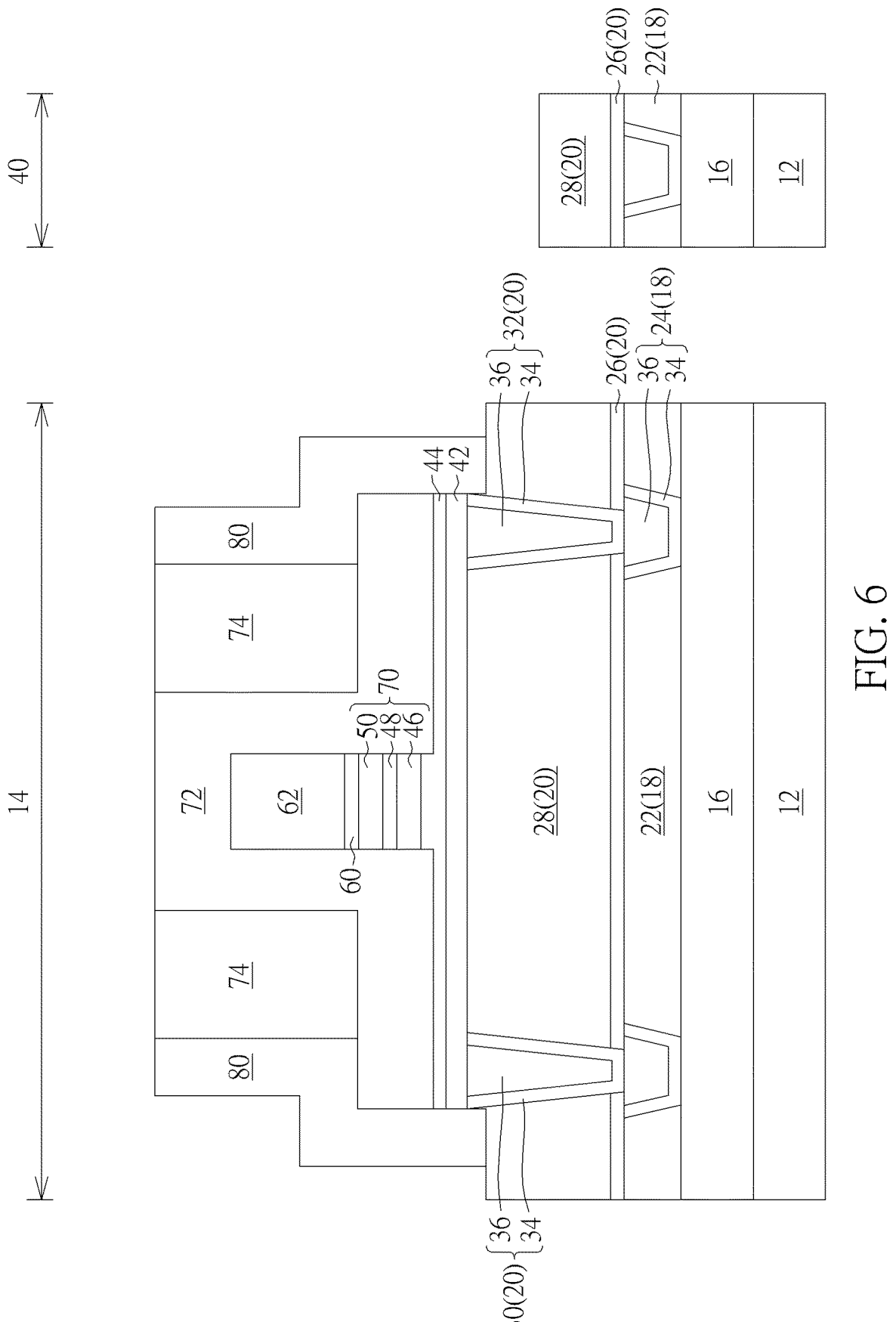

Next, as shown in FIG. 6, an etching process could be conducted without forming any patterned mask to remove part of the second cap layer 80 on the MRAM region 14 and all the second cap layer 80 on the logic region 40 and expose the top surface of the IMD layer 28. Preferably, the top surface of the second cap layer 80 adjacent to sidewalls of the IMD layer 74 is even with the top surface of the IMD layer 74 and the first cap layer 72.

Figure 7:
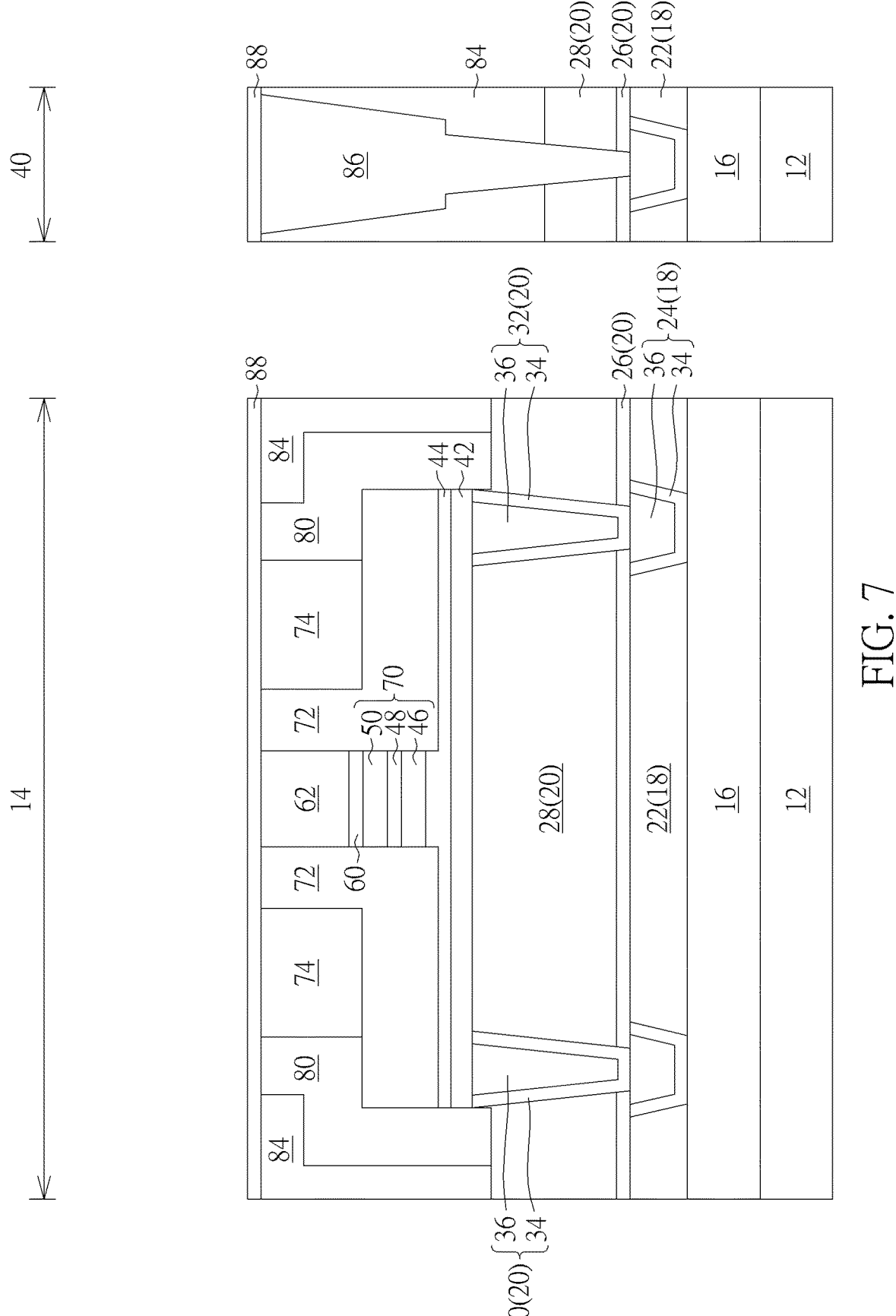

Next, as shown in FIG. 7, another IMD layer 84 is formed on the MRAM region 14 and logic region 40, and a planarizing process such as chemical mechanical polishing (CMP) is conducted to remove part of the IMD layer 84, part of the second cap layer 80, part of the IMD layer 74, and part of the first cap layer 72 so that the top surface of the remaining IMD layer 84 is even with the top surface of the hard mask 62. Next, a pattern transfer process is conducted by using a patterned mask (not shown) to remove part of the IMD layer 84, part of the IMD layer 28, and part of the stop layer 26 on the logic region 40 to form a contact hole (not shown) exposing the metal interconnection 24 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 86 in the contact hole electrically connecting the metal interconnection 24. Next, a stop layer 88 is formed on the hard mask 62 and the metal interconnection 86. In this embodiment, the IMD layer 84 and the IMD layer 74 could be made of same or different material such as silicon oxide and the stop layer 88 could include silicon oxide, silicon nitride, or SiCN.

Figure 8:
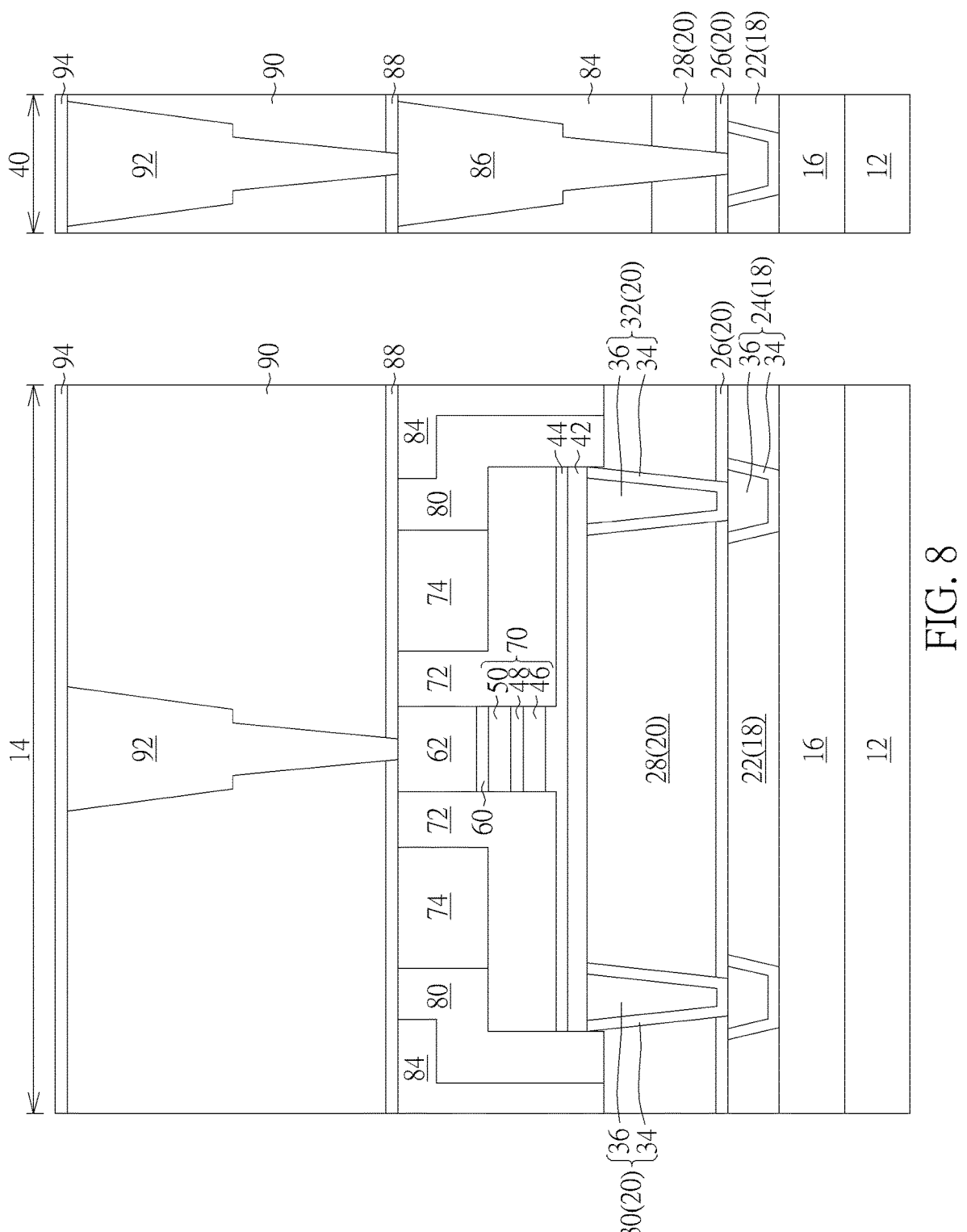

Next, as shown in FIG. 8, an IMD layer 90 is formed on the stop layer 88 of the MRAM region 14 and logic region 40, and a pattern transfer process is conducted by using a patterned mask (not shown) to remove part of the IMD layer 90 and part of the stop layer 88 for forming contact holes (not shown) exposing the hard mask 62 and the metal interconnection 86 and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form metal interconnections 92 in the contact hole electrically connecting the hard mask 62 and the metal interconnection 86. Next, a stop layer 94 is formed on the metal interconnection 92. In this embodiment, the IMD layer 90 preferably includes an ultra low-k (ULK) dielectric layer including but not limited to for example porous material or silicon oxycarbide (SiOC) or carbon doped silicon oxide (SiOCH).

Figure 9:
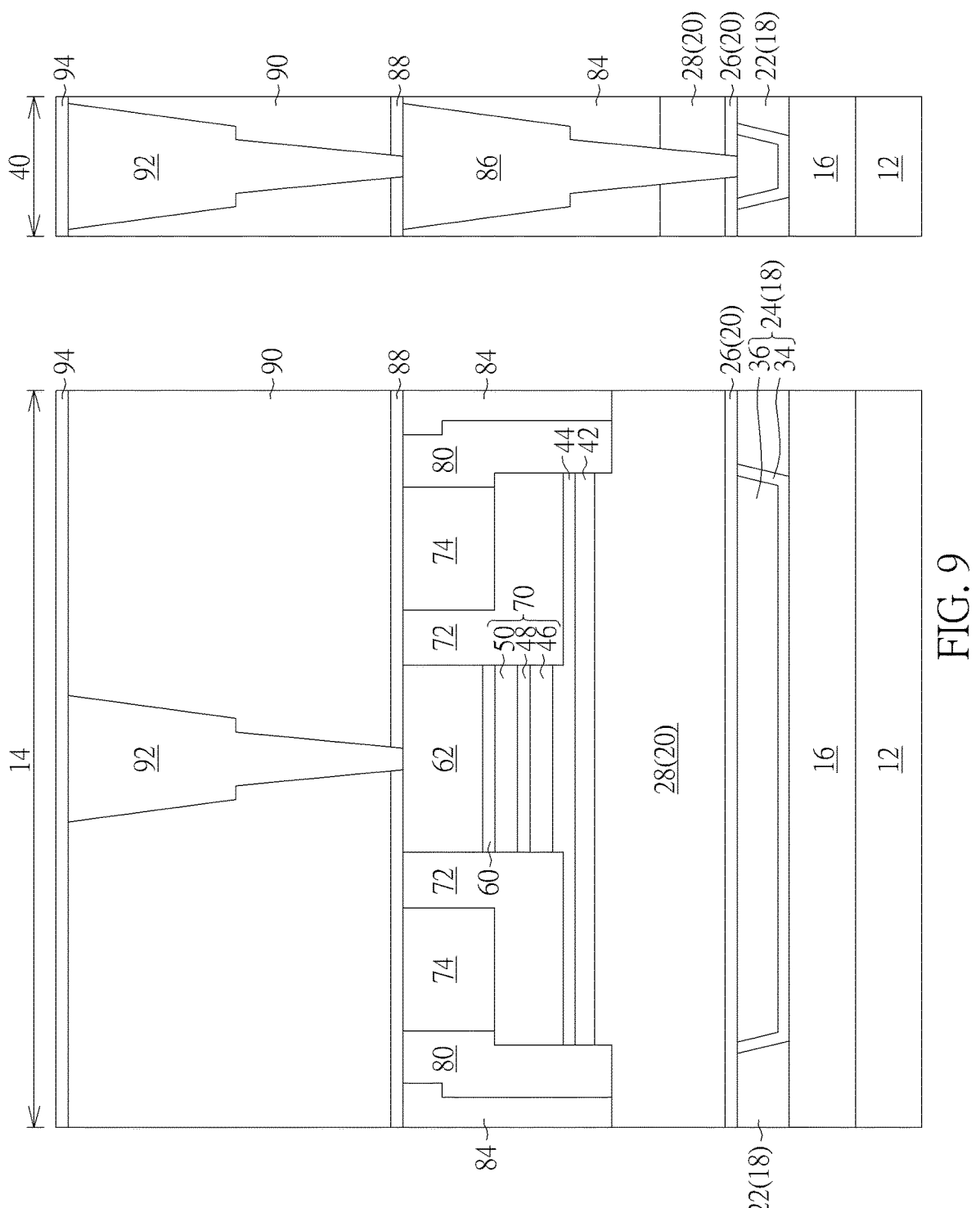
FIG. 9 illustrates a structural view of a MRAM device according to an embodiment of the present invention.

Referring to FIG. 9, FIG. 9 illustrates a structural view of a MRAM device taken along another angle such as along the X-direction according to an embodiment of the present invention. As shown in FIG. 9, the MRAM device includes a SOT layer 44 disposed on the substrate 12, a MTJ 70 disposed on the SOT layer 4, a first cap layer 72 adjacent to the MTJ 70, an IMD layer 74 adjacent to the first cap layer 72, a second cap layer 80 adjacent to the first cap layer 72 and the IMD layer 74, and an IMD layer 84 adjacent to the second cap layer 80. In contrast to the bottom surface of the bottom electrode 42 directly contacts two metal interconnections 32 as shown in FIG. 8, the bottom surface of the bottom electrode 42 in this embodiment preferably not contacting any metal interconnection but only contacting the IMD layer 28 directly.

Moreover, the top surface of the second cap layer 80 is even with the top surfaces of the IMD layer 74, the first cap layer 72, and the hard mask 62, and the second cap layer 80 is disposed on sidewalls of the IMD layer 74, sidewalls of the first cap layer 72, sidewalls of the SOT layer 44, sidewalls of the bottom electrode 42, and sidewalls of the IMD layer 28. The bottom surface of the second cap layer 80 could be slightly lower than the bottom surface of the bottom electrode 42 as shown in this embodiment or could be even with the bottom surface of the bottom electrode 42 according to other embodiment of the present invention. Preferably, the first cap layer 72 and the second cap layer 80 are made of same material such as silicon nitride.

Figure 10:
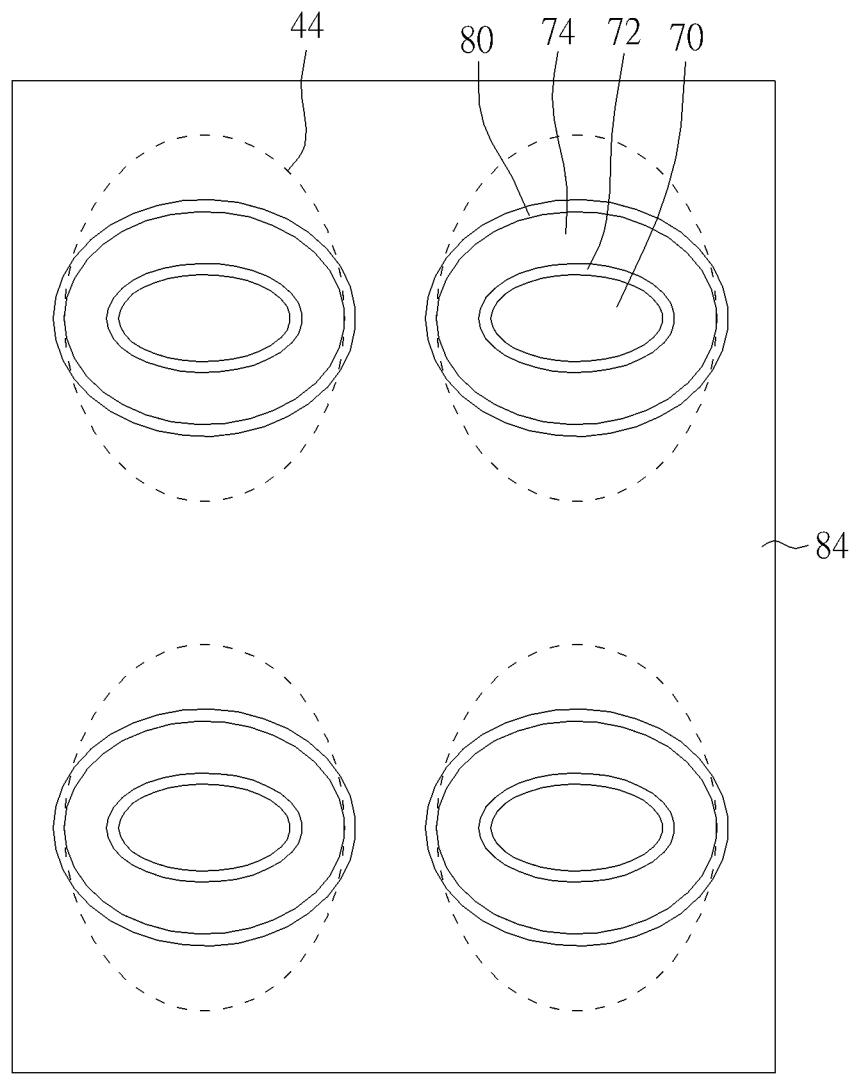
FIG. 10 illustrates a top view of the MRAM device and surrounding elements of FIG. 8.
Figure 11:
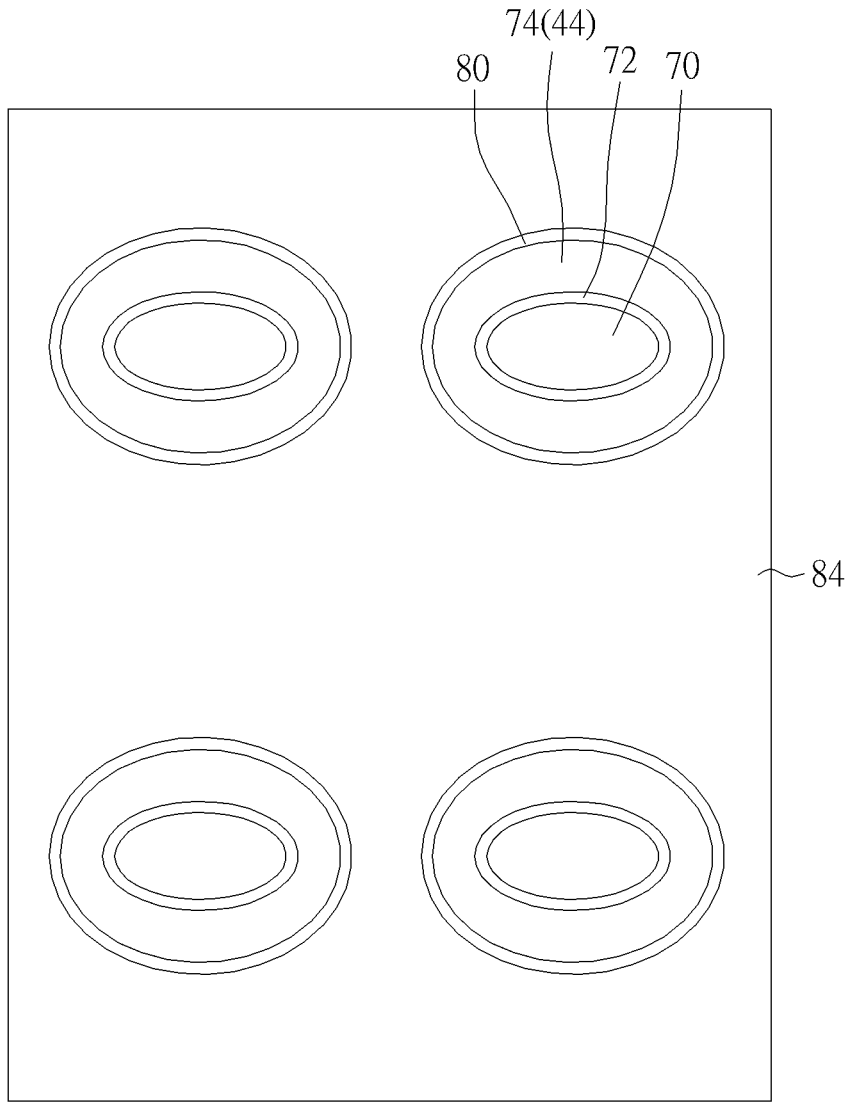
FIG. 11 illustrates a top view of the MRAM device and surrounding elements of FIG. 9.

Referring to FIGS. 10-11, FIG. 10 illustrates a top view of the MRAM device and surrounding elements of FIG. 8 and FIG. 11 illustrates a top view of the MRAM device and surrounding elements of FIG. 9. As shown in FIGS. 10-11, the MRAM device preferably includes at least a SOT layer 44 disposed on the substrate 12, a hard mask 62 or MTJ 70 disposed on the SOT layer 44, a first cap layer 72 around the MTJ 70, an IMD layer 74 around the first cap layer 72, a second cap layer 80 around the IMD layer 74, and another IMD layer 84 surrounding the second cap layer 80.

As shown in FIGS. 10-11, the MTJ 70 if viewed from a top view perspective includes a circular or more specifically an ellipse or elliptical shape, the first cap layer 72 includes a first ring around the MTJ 70, the IMD layer 74 includes a second ring around the first cap layer 72, the second cap layer 80 includes a third ring around the IMD layer 74, and the IMD layer 84 surrounds multiple MTJs 70 or the second cap layer 80 at the same time. Under a top view perspective, the first cap layer 72 and the second cap layer 80 preferably share substantially equal width or the distance between two sidewalls of each of the layers 72, 80, the width of the first cap layer 72 or the second cap layer 80 is less than the width of the IMD layer 74, and the width of the IMD layer 74 could be twice or more such as three times, four times, or even five times the width of each of the first cap layer 72 or the second cap layer 80.

It should be noted that the SOT layer 44 in FIG. 10 is labeled with a dotted line, in which the SOT layer 44 also includes an elliptical shape surrounding the ellipse of the IMD layer 74. In contrast to the IMD layer 74 having a long axis extending along X-direction and a short axis extending along Y-direction, the SOT layer 44 has a short axis extending along X-direction and a long axis extending along Y-direction, in which the short axis extending along X-direction of the SOT layer 44 is substantially equal to the long axis of the IMD layer 74 also extending along X-direction. Nevertheless, the long axis of the SOT layer 44 extending along Y-direction is approximately 1.5 to 3 times the short axis of the IMD layer 74 extending along Y-direction.

In contrast to the SOT layer 44 and the IMD layer 74 shown in FIG. 10 having long axes and short axes extending along different directions, the long axes and short axes of the SOT layer 44 and the IMD layer 74 shown in FIG. 11 are extending along same direction thereby having same distance. In other words, the SOT layer 44 under a top view perspective would overlap the IMD layer 74 completely as shown in FIG. 11.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:

forming a spin orbit torque (SOT) layer on a substrate;

forming a magnetic tunneling junction (MTJ) on the SOT layer;

forming a first cap layer on the MTJ;

forming a first inter-metal dielectric (IMD) layer on the first cap layer; and forming a second cap layer on the first cap layer and the first IMD layer and directly contacting a top surface and sidewalls of the first IMD layer after forming the first IMD layer.

2. The method of claim 1, further comprising:

forming a second IMD layer on the first cap layer, the first IMD layer, and the second cap layer; and planarizing the first cap layer, the first IMD layer, the second cap layer, and the second IMD layer.

3. The method of claim 1, further comprising:

performing a first etching process to pattern the first IMD layer; and performing a second etching process to pattern the first cap layer and the first IMD layer.

4. The method of claim 3, further comprising patterning the first IMD layer to expose a top surface of the first cap layer.

5. The method of claim 3, further comprising performing the second etching process so that top surfaces of the first cap layer and the first IMD layer are coplanar.

6. The method of claim 1, further comprising forming the second cap layer on a sidewall of the SOT layer.

7. The method of claim 1, further comprising forming the second cap layer on a sidewall of the first cap layer.

8. The method of claim 1, further comprising forming the second cap layer on a sidewall of the first IMD layer.

9. The method of claim 1, wherein the first cap layer and the second cap layer comprise same material.

10. A semiconductor device, comprising:

a spin orbit torque (SOT) layer on a substrate;

a magnetic tunneling junction (MTJ) on the SOT layer;

a first cap layer adjacent to the MTJ;

a first inter-metal dielectric (IMD) layer adjacent to the first cap layer; and a second cap layer adjacent to the first cap layer and the first IMD layer, wherein, top surfaces of the first cap layer, the first IMD layer, and the second cap layer are coplanar.

11. The semiconductor device of claim 10, further comprising a second IMD layer adjacent to the second cap layer.

12. The semiconductor device of claim 10, wherein the second cap layer is on a sidewall of the first cap layer.

13. The semiconductor device of claim 10, wherein the first cap layer and the second cap layer comprise same material.

14. A semiconductor device, comprising:

a spin orbit torque (SOT) layer on a substrate;

a magnetic tunneling junction (MTJ) on the SOT layer, wherein the MTJ comprises a circular shape in a top view;

a first cap layer around the MTJ, wherein the first cap layer comprises a first ring in a top view and the first ring comprises a first circular ring; and a first inter-metal dielectric (IMD) layer around the first cap layer, wherein the first IMD layer comprises a second ring in a top view and the second ring comprises a second circular ring.

15. The semiconductor device of claim 14, further comprising a second cap layer around the first IMD layer, wherein the second cap layer comprises a third ring in a top view.

16. The semiconductor device of claim 15, further comprising a second IMD layer around the second cap layer.

17. The semiconductor device of claim 14, wherein the MTJ comprises an ellipse in a top view.

* * * * *